United States Patent
Xiang et al.

(10) Patent No.: US 11,644,750 B2
(45) Date of Patent: May 9, 2023

(54) NEGATIVE PHOTORESIST USED FOR SEMICONDUCTOR ENCAPSULATION PROCESS

(71) Applicant: JIANGSU AISEN SEMICONDUCTOR MATERIAL CO., LTD., Qiandeng Town Kunshan (CN)

(72) Inventors: Wensheng Xiang, Qiandeng Town Kunshan (CN); Kun Zhu, Qiandeng Town Kunshan (CN); Lan Lu, Qiandeng Town Kunshan (CN); Bing Zhang, Qiandeng Town Kunshan (CN); Jianlong Zhao, Qiandeng Town Kunshan (CN)

(73) Assignee: Jiangsu Aisen Semiconductor Material Co., Ltd., Qiandeng Town Kunshan (CN)

( * ) Notice: Subject to any disclaimer, the term of this patent is extended or adjusted under 35 U.S.C. 154(b) by 190 days.

(21) Appl. No.: 17/040,850

(22) PCT Filed: Dec. 11, 2019

(86) PCT No.: PCT/CN2019/124611
§ 371 (c)(1),
(2) Date: Sep. 23, 2020

(87) PCT Pub. No.: WO2020/125520
PCT Pub. Date: Jun. 25, 2020

(65) Prior Publication Data
US 2021/0018838 A1 Jan. 21, 2021

(30) Foreign Application Priority Data
Dec. 19, 2018 (CN) .......................... 201811553209.5

(51) Int. Cl.
G03F 7/038 (2006.01)
G03F 7/075 (2006.01)

(52) U.S. Cl.
CPC .......... *G03F 7/0382* (2013.01); *G03F 7/0758* (2013.01)

(58) Field of Classification Search
CPC ............................. G03F 7/0382; G03F 7/0758
See application file for complete search history.

(56) References Cited

FOREIGN PATENT DOCUMENTS

| CN | 102161875 | A |   | 8/2011  |         |
|----|-----------|---|---|---------|---------|
| CN | 102597879 | A |   | 7/2012  |         |
| CN | 103748516 | A |   | 4/2014  |         |
| CN | 104302708 | A |   | 1/2015  |         |
| CN | 104520768 | A |   | 4/2015  |         |
| CN | 105301907 | A |   | 2/2016  |         |
| CN | 105541686 | A |   | 5/2016  |         |
| CN | 107430339 | A |   | 12/2017 |         |
| CN | 107561862 | A |   | 1/2018  |         |
| CN | 20708194  | U |   | 3/2018  |         |
| CN | 207081941 | U |   | 3/2018  |         |
| CN | 108003699 | A |   | 5/2018  |         |
| CN | 108363275 | A |   | 8/2018  |         |
| CN | 109541889 | A |   | 3/2019  |         |
| CN | 110317001 | A | * | 10/2019 | ............ B33Y 70/00 |
| JP | 2014119641| A |   | 6/2014  |         |
| JP | 2015087541| A | * | 5/2015  |         |
| KR | 20090072993| A |  | 7/2009  |         |
| KR | 2010074617| A | * | 7/2010  |         |

OTHER PUBLICATIONS

English translation of KR2010074617. (Year: 2010).*
English translation of JP2015087541. (Year: 2015).*
English translation of CN110317001. (Year: 2019).*

* cited by examiner

*Primary Examiner* — Chanceity N Robinson
*Assistant Examiner* — Anna Malloy
(74) *Attorney, Agent, or Firm* — David B. Tingev; Bryant J. Keller; Kirton McConkie

(57) ABSTRACT

Provided is a negative photoresist used for a semiconductor encapsulation process, belonging to the technical field of semiconductor processing. A negative photoresist formulation includes 40-65 wt % of modified epoxy acrylate, 3-6 wt % of photosensitizer, 100-1000 ppm of leveling agent, and the remainder of solvent; the leveling agent is a solution of a 7:3 mass ratio of polydimethylsiloxane copolymer having a molecular weight of 3000-6000 and propylene glycol monomethyl ether acetate. If the negative photoresist is coated at a thickness of about 50 um, the coating uniformity can be controlled to below 5%, ensuring the quality of exposure such that the thickness of electroplated copper meets requirements.

4 Claims, No Drawings

NEGATIVE PHOTORESIST USED FOR SEMICONDUCTOR ENCAPSULATION PROCESS

TECHNICAL FIELD

The present disclosure relates to the field of semiconductor processing and, for example, to a negative photoresist used for a semiconductor encapsulation process.

BACKGROUND

The negative photoresist with a high film thickness, as a patterned transferring tool, is a composition of resin, photosensitive compound, additives, and solvent. The negative photoresist, upon exposure to ultraviolet light, forms crosslinks at the exposed portion. The exposed portion is insoluble in a developer while the unexposed portion dissolves in the developer such that a desired image is formed.

The negative photoresist in a flip-chip bumping process is characterized by unique design: it has a high aspect ratio, requires the forming of a 110-micron film thickness, a coating uniformity within 10% and a desired section angle within 88-90°, and has the characteristics of being capable of withstanding copper electroplating, etc. To meet the above characteristic elements, the photoresist firstly needs to meet the requirement of high solid content, and its viscosity can be continuously increased as the solid content increases. This thereby brings about some problems. For example, currently, the manufacturers using the photoresist use pumps to extract the photoresist. The pump needs to be replaced when the viscosity of the photoresist is too high, and the extraction amount of each piece of photoresist is increased when the viscosity becomes high, potentially increasing the use cost of the manufacturers. In addition, the increase in viscosity causes a difference in coating uniformity, and particularly in 8-inch and 12-inch wafers, the difference in film thickness between the center and the edge becomes large, and the increase in film thickness difference causes a change in exposure amount and a difference in thickness of the electroplated copper.

Therefore, the uniformity and film thickness need to be considered when initially designing the formulation of photoresist used for the flip-chip bumping process.

SUMMARY

The following is a summary of the subject matter described in the present disclosure in detail. This summary is not intended to limit the scope of the claims.

The main object of the present disclosure is to provide a negative photoresist used for a semiconductor encapsulation process, to make the coating thickness and uniformity better.

In the present disclosure, the above object is realized through the following solution: a negative photoresist for a semiconductor encapsulation process, the formulation of which includes 40-65 wt % of modified epoxy acrylate, 3-6 wt % of photosensitizer, 100-1000 ppm of leveling agent, and the remainder of solvent. The leveling agent is a solution of polydimethylsiloxane copolymer having a molecular weight of 3000-6000 and propylene glycol monomethyl ether acetate mixed with a mass ratio of 7:3.

Specifically, the modified epoxy acrylate has the following structure, wherein m comprises an integer:

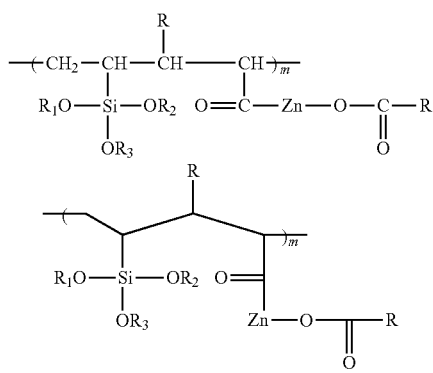

The modified epoxy acrylate has a molecular weight of 80,000-140,000 and a molecular weight distribution of 2.0-4.0. In the above structure, R is one of fluorine, hydrogen, hydroxyl, methoxyl, ethoxyl, methyl, ethyl and propyl, and $R_1$, $R_2$ and $R_3$ are respectively selected from one of hydrogen, methyl and ethyl.

Specifically, the photosensitizer is a mixture of (4-hydroxyphenyl)methylbenzyl sulfonium hexafluoroantimonate and 2-diazo-1-naphthol-5-sulfonyl chloride ester compound mixed with a mass ratio of 3:7.

Specifically, the solvent is one of 200# SOLVENT OIL, 100# SOLVENT OIL and S-100 SOLVENT OIL. The 200# SOLVENT OIL comprising a mixture of petroleum fractions; the 100# SOLVENT OIL comprising trimethylbenzene and tetramethylbenzene, and at least one of ethylbenzene and a mixture of ethylbenzene; and the S-100 SOLVENT OIL comprising a mixture of a light aromatic solvent.

Specifically, the amount of the leveling agent is 300-500 ppm.

Through the above solution, the present disclosure has the following beneficial effects:

When the negative photoresist of the present disclosure is coated at a thickness of about 50 um, the coating uniformity can be controlled to below 5%, ensuring the quality of exposure such that the thickness of electroplated copper meets requirements.

DETAILED DESCRIPTION

A negative photoresist used for a semiconductor encapsulation process is provided. The formulation of the negative photoresist includes 40-65 wt % of modified epoxy acrylate, 3-6 wt % of photosensitizer, 100-1000 ppm of leveling agent, and the remainder of solvent. The leveling agent is a solution of polydimethylsiloxane copolymer having a molecular weight of 3000-6000 and propylene glycol monomethyl ether acetate mixed with a mass ratio of 7:3.

The present disclosure will be further described in detail hereinafter in conjunction with specific examples.

EXAMPLES 1 TO 6

Raw materials are mixed evenly according to the ratios shown in Table 1.

The leveling agent is a solution of polydimethylsiloxane copolymer having a molecular weight of 3000-6000 and propylene glycol monomethyl ether acetate mixed with a mass ratio of 7:3. The leveling agent can affect the viscosity of the product and thus affect the coating uniformity.

Specifically, the modified epoxy acrylate has the following structure, wherein m comprises an integer:

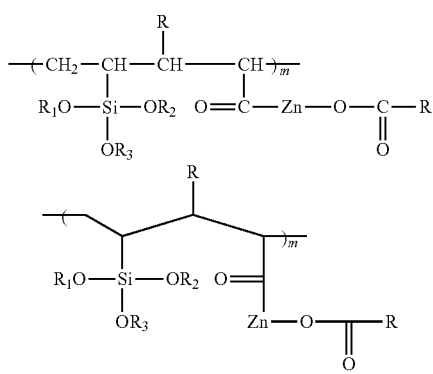

The modified epoxy acrylate has a molecular weight of 80,000-140,000 and a molecular weight distribution of 2.0-4.0. In the above structure, R is one of fluorine, hydrogen, hydroxyl, methoxyl, ethoxyl, methyl, ethyl and propyl, and $R_1$, $R_2$ and $R_3$ are respectively selected from one of hydrogen, methyl and ethyl. The modified epoxy acrylate can affect the thickness of the coating film.

The photosensitizer is a mixture of (4-hydroxyphenyl) methylbenzyl sulfonium hexafluoroantimonate and 2-diazo-1-naphthol-5-sulfonyl chloride ester compound mixed with a mass ratio of 3:7, The photosensitizer can affect the exposure performance of the product.

The solvent is one of 200# SOLVENT OIL, 100# SOLVENT OIL and S-100 SOLVENT OIL, or a mixture of two or more thereof. The solvent can affect the coating uniformity. The 200# SOLVENT OIL comprising a mixture of petroleum fractions; the 100# SOLVENT OIL comprising trimethylbenzene and tetramethylbenzene, and at least one of ethylbenzene and a mixture of ethylbenzene; and the S-100 SOLVENT OIL comprising a mixture comprising a light aromatic solvent.

The test manner is as following: under different rotating speeds, a 12-inch silicon wafer was baked at a temperature of 120° C. for 10 minutes and coated with photoresist with a thickness of 110 um, and the coating uniformity of the photoresist was tested by using the F50 film thickness meter from Filmetrics, Inc.

TABLE 1

| | Example 1 | Example 2 | Example 3 | Example 4 | Example 5 | Example 6 |
|---|---|---|---|---|---|---|
| Modified epoxy acrylate/ wt % | 40 | 65 | 50 | 55 | 46.5 | 53 |
| Photosensitizer/ wt % | 3 | 6 | 4 | 5 | 3.5 | 4 |
| Leveling agent/ ppm | 100 | 1000 | 300 | 400 | 500 | 800 |
| Solvent/wt % | 200# SOLVENT OIL | 100# SOLVENT OIL | 200# SOLVENT OIL | S-100 SOLVENT OIL | 100# SOLVENT OIL | S-100 SOLVENT OIL |
| | 57 | 29 | 46 | 40 | 50 | 43 |

The test manner is as follows.

Film thickness uniformity test: the tested photoresist was coated by using a spin coater, and baked at 110° C. for 5 minutes after coating, and the coating thickness and uniformity were tested by using a film thickness meter.

The results are shown in Table 2.

TABLE 2

| | Film thickness/um | | | | | | |
|---|---|---|---|---|---|---|---|
| | Center | At ½ | At ¼ | At ⅛ | Edges | Average | u % |
| Example 1 | 55.2 | 57.9 | 59.3 | 62.8 | 66.1 | 60.26 | 9.0 |
| Example 2 | 52.3 | 53.5 | 54.8 | 55.7 | 57.7 | 54.8 | 4.9 |
| Example 3 | 50.3 | 51.5 | 51.8 | 53.2 | 54.7 | 52.3 | 4.2 |
| Example 4 | 49.4 | 49.9 | 50.4 | 51.2 | 51.9 | 50.56 | 2.5 |
| Example 5 | 50.6 | 51.1 | 51.8 | 52.5 | 53.7 | 51.9 | 2.9 |
| Example 6 | 50.5 | 50.9 | 51.7 | 53.5 | 55.8 | 52.5 | 5.0 |

As can be known in Table 2, when the negative photoresist is coated at a thickness of about 50 um, the coating uniformity can be controlled to below 5%, ensuring the quality of exposure such that the thickness of electroplated copper meets requirements.

The above are only some embodiments of the present disclosure. For those skilled in the art, a number of improvements and modifications can be made without departing from the principle of the present disclosure, and these improvements and modifications are within the scope of the present disclosure.

What is claimed is:

1. A negative photoresist for a semiconductor encapsulation process, consisting of 40-65 wt % of a compound with a structure of:

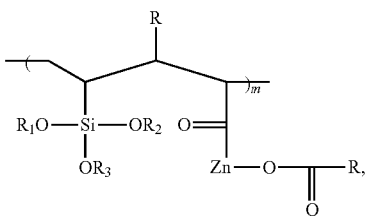

3-6 wt % of photosensitizer, 100-1000 ppm of a leveling agent, and a remainder of solvent; wherein m is an integer;
  wherein the compound has a molecular weight of 80,000-140,000 and a molecular weight distribution of 2.0- 4.0, wherein R is one of fluorine, hydrogen, hydroxyl, methoxyl, ethoxyl, methyl, ethyl, and propyl, and $R_1$, $R_2$, and $R_3$ are respectively selected from one of hydrogen, methyl, and ethyl; and
  wherein the leveling agent is a solution of polydimethylsiloxane copolymer having a molecular weight of 3000-6000 and propylene glycol monomethyl ether acetate mixed with a mass ratio of 7:3.

2. The negative photoresist according to claim 1, wherein the photosensitizer is a mixture of (4-hydroxyphenyl)methylbenzyl sulfonium hexafluoroantimonate and 2-diazo-1-naphthol-5-sulfonyl chloride ester compound mixed with a mass ratio of 3:7.

3. The negative photoresist according to claim 1, wherein the solvent is one of a first solvent oil, a second solvent oil, and a third solvent oil, wherein the first solvent oil comprises a mixture of petroleum fractions, wherein the second solvent oil comprises trimethylbenzene and tetramethylbenzene, and also contains at least one of ethylbenzene and a mixture of ethylbenzene, and wherein the third solvent oil comprises a mixture comprising a light aromatic solvent.

4. The negative photoresist according to claim 1, wherein an amount of the leveling agent is 300-500 ppm.

* * * * *